(12) United States Patent
Barthel et al.

(10) Patent No.: US 7,372,248 B2
(45) Date of Patent: May 13, 2008

(54) ELECTRONIC CIRCUIT, SYSTEM WITH AN ELECTRONIC CIRCUIT AND METHOD FOR TESTING AN ELECTRONIC CIRCUIT

(75) Inventors: Herbert Barthel, Herzogenaurach (DE); Ingmar Binder, Ursensollen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/494,016

(22) Filed: Jul. 27, 2006

(65) Prior Publication Data

US 2007/0038403 A1 Feb. 15, 2007

(30) Foreign Application Priority Data

Jul. 29, 2005 (EP) .................................. 05016557

(51) Int. Cl.
*G01R 19/00* (2006.01)
*G01R 31/26* (2006.01)
(52) U.S. Cl. .................... 324/76.11; 324/73.1; 324/765
(58) Field of Classification Search ............ 324/76.11, 324/527, 535, 617, 73.1; 377/28
See application file for complete search history.

(56) References Cited

U.S. PATENT DOCUMENTS

| 4,519,090 | A | * | 5/1985 | Stackhouse et al. .......... 377/29 |
| 6,477,674 | B1 | | 11/2002 | Bates et al. |
| 6,867,613 | B1 | | 3/2005 | Bienek |
| 2004/0267479 | A1 | | 12/2004 | Querbach et al. |

* cited by examiner

*Primary Examiner*—Vincent Q. Nguyen

(57) ABSTRACT

An electronic circuit having an input, an output with an input filter for delaying a change of an input signal and a control component for supplying an output signal and evaluating the input signal. The delay is a time constant. An industrial automation system is provide with the electronic circuit and a fail-safe component connected to an input and an output of the circuit. To increase the probability of detecting errors in the electronic circuit, the control component is provided for supplying a test signal for output through the output, for making a first evaluation of the input signal to be provided immediately after the output of a test signal and for making a second evaluation of the input signal after expiry of a time after output of the test signal which at least corresponds to the time constant. A method for testing an electronic circuit is also provided.

16 Claims, 1 Drawing Sheet

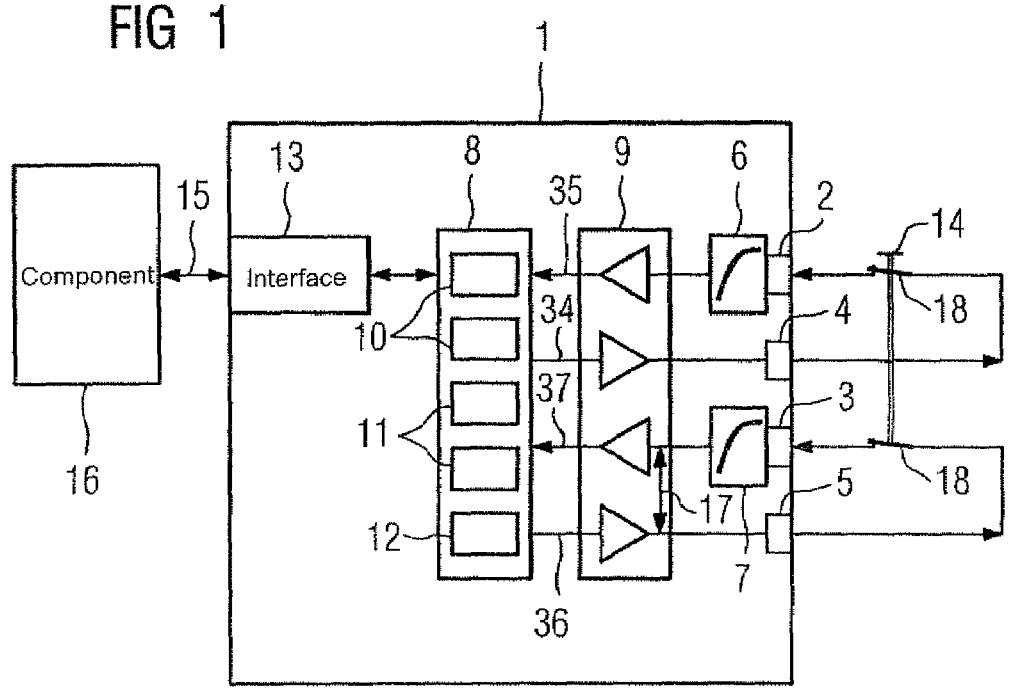
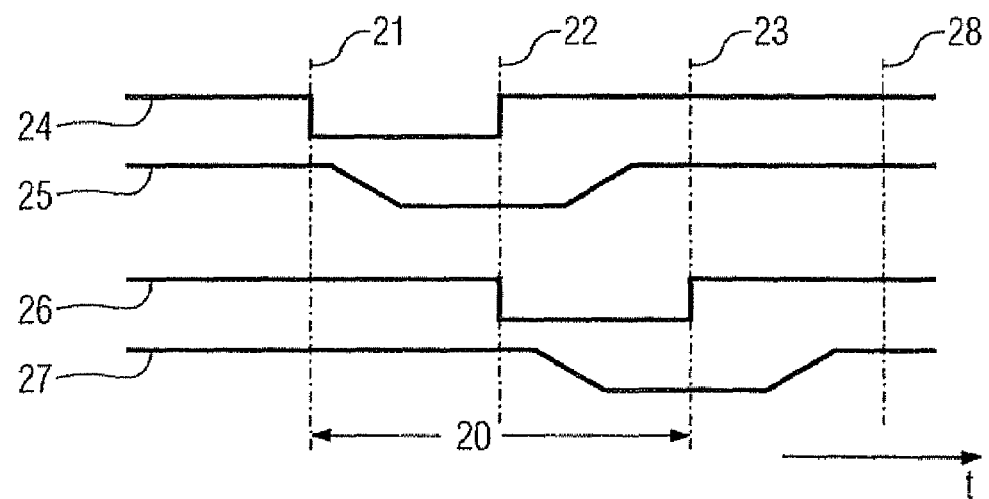

ELECTRONIC CIRCUIT, SYSTEM WITH AN ELECTRONIC CIRCUIT AND METHOD FOR TESTING AN ELECTRONIC CIRCUIT

CROSS REFERENCE TO RELATED APPLICATIONS

This application claims priority of European application No. 05016557.0 EP filed Jul. 29, 2005, which is incorporated by reference herein in its entirety.

FIELD OF INVENTION

The invention relates to an electronic circuit with at least one input and at least one output, with the input featuring an input filter for delaying a change in an input signal, with the delay being characterized by a time constant and with a control component for provision of an output signal and for evaluation of the input signal. The invention also relates to a system with such an electronic circuit and at least one fail-safe component, which is connected to at least one input and at least one output of the circuit, as well as to a method for testing an electronic circuit.

BACKGROUND OF INVENTION

In fail-safe systems in particular there must be a high probability of all kinds of error being detected and thereby dealt with so that they do not trigger any impermissible reaction. This especially also relates to sensors and to electronic circuits which accept the signals of the sensors as their input signal. Such an electronic circuit is for example a digital input chip. An obstacle to the use of standard input/output chips for safety systems is frequently a common input/output driver chip. Specific internal short circuits in this driver chip in particular cannot be covered by conventional tests. The relevant input would also have to be tested from outside in such cases. For applications in safety systems however all short circuits and interruptions have to be covered, especially internal short circuits within modules as well. In process and manufacturing technology there are modules for a diversity of applications, which also feature outputs in addition to inputs. Such modules are for example the operating panels usually used. The inputs and outputs are frequently embodied as digital inputs or digital outputs. Keyswitches can be connected for example via digital inputs and signal lamps can be connected via digital outputs. Typically a relatively large number of such inputs and outputs are present, of which often only some are used. The use of at least a part of the inputs/outputs of standard circuits for fail-safe tasks usually fails due to the fact that the safety requirements cannot be fulfilled with the standard hardware.

The object of the invention is to increase the probability of error detection for an electronic circuit with at least one input and at least one output.

This object is achieved by an electronic circuit with at least one input and at least one output, with the input featuring an input filter for delaying the change to an input signal, with the delay being characterized by a time constant, with a control component being provided for supplying an output signal and for evaluation of the input signal, with the control component being provided for supply of a test signal for output via an output and for a first evaluation of the input signal directly after the output of the test signal and for a second evaluation of the input signal after a timer has expired after output of the test signal which corresponds to the at least one time constant.

This object is achieved by a system, especially an industrial automation system, with such a circuit, with the system featuring at least one fail-safe component, which is connected to at least one input and at least one output of the circuit such that the relevant input is connected electrically conductively to the relevant output in the safe state.

This object is achieved by a method for testing an electronic circuit, with the electronic circuit featuring at least one input and at least one output, by which method a modification of the input signal is delayed by an input filter of the input, where the delay is characterized by a time constant, with the input signal being supplied and evaluated by a control component, with a test signal supplied by the control component being output via the output and the input signal being evaluated for the first time immediately after the input of a test signal and for the second time after expiry of a timer after output of the test signal which at least corresponds to the time constant.

An embodiment of the invention skillfully employs the fact that inputs of an electronic circuit are usually provided with input filters for delaying a change in the input signal, especially for noise filtering. The electronic circuit can be tested for internal short circuits, cross-connection short circuits and interruptions by the value at the input being first tested immediately after the output of an output signal and subsequently again after the filter constant has expired. As a result of the delay function of the input filter, the value of the input signal in the error-free case may not change the first time that it is read, i.e. when immediately read or evaluated. The value of the input signal may not change until the filter time constant of the input filter has expired. If it changes before this point this indicates the presence of a hardware error, especially a short circuit or a cross connection within the electronic circuit.

In accordance with an advantageous embodiment of the invention the control component for first evaluation of the input signal is provided within a period after the output of the test signal which corresponds to a maximum of 10 percent of the time constant. This ensures that the input signal is actually first evaluated immediately after output of the test signal and that no further change of the input signal after the input filter can be caused by a change in the input signal before the input filter. Both the first and also the second evaluation of the input signal are basically undertaken after the input filter, i.e. after the input signal has passed through the input filter. The input signal is thus not recorded and evaluated by the control component until after the input filter, either directly after it or further intermediate components, e.g. a driver chip.

Further indicators of errors in the electronic circuit can be determined, if, in accordance with an advantageous embodiment of the invention the control component is provided for comparing the first and the second evaluation with the test signal in each case.

Advantageously a fail-safe reaction is initiated by the control component, provided the first evaluation produces an input signal equal to the test signal. Since at the time of the first evaluation the input signal must not be equal to the test signal, a match indicates an error within the electronic circuit, which is handled by the fail-safe reaction. A fail-safe reaction brings the electronic circuit and a system connected to the circuit into a safe state, frequently achieved by immediate disconnection of all or at least one part of the actuators in the system.

In accordance with a further advantageous embodiment of the invention at least one driver chip is provided for converting the input and output signals, with the driver chip being arranged between the control component and the input or the output. The driver chip in particular allows a voltage or current conversion and/or an amplification of the input and output signals.

An especially simple evaluation of the input signals is produced, if, in accordance with a further advantageous embodiment, the at least one input is a digital input and the at least one output a digital output. In this case the test signal is executed as a signal change from zero to one or vice versa.

To meet increased safety requirements, especially for achieving a safety class greater than SIL 2 (SIL=Safety Integrity Level, in accordance with IEC 61508), in accordance with a further advantageous embodiment of the invention, it is proposed that at least two inputs and two outputs be provided. The safety is thus increased by the redundant detection of the sensor signals present at the relevant inputs/outputs.

In accordance with a further advantageous embodiment of the invention the control component features fail-safe firmware components. These fail-safe firmware components are especially suitable for executing the provision of the output signal and for evaluation of the input signal. This allows standard electronic circuits which do not have any fail-safe hardware attributes to be made fit for handling fail-safe tasks by expansion of the firmware of the control component.

In accordance with a further advantageous embodiment of the invention the circuit is particularly suitable for use within fail-safe systems because at least one fail-safe component is able to be connected to at least one input and at least one output such that the relevant input is connected to the relevant output so that it is electrically conductive in the safe state. The safe state is for example the state in which a fail-safe component, e.g. an emergency cutout button, is not activated, meaning that the conductive connection is established.

The invention is described and explained in greater detail below with reference to the exemplary embodiment shown in the figures.

BRIEF DESCRIPTION OF THE DRAWINGS

The figures show:
FIG. 1 an electronic circuit in an automation system and
FIG. 2 the timing curves of the input and output signals, especially during a test cycle.

DETAILED DESCRIPTION OF INVENTION

FIG. 1 shows an electronic circuit 1 with two inputs 2, 3 and two outputs 4, 5. The inputs 2, 3, digital inputs in accordance with exemplary embodiment, each have an input filter 6 or 7 for delaying a change to an input signal. Such an input filter is typically a 1st-order delay element 1, e.g. an RC filter. A control component 8 is used for provision of output signals as well as for evaluation the input signals. The control component 8 features both non-fail-safe firmware components 10 and also fail-safe firmware components 12. The control 8 communicates bidirectionally with an interface element 13, which serves as an interface to a communication network 15 which is connected to further components 16 of an industrial automation system. Such a further component 16 can especially be a Programmable Logic Controller. The electronic circuit 1 is a part of the industrial automation system. The electronic circuit 1, in accordance with the exemplary embodiment a peripheral module of an automation system, is connected via the inputs 2, 3 and the outputs 4, 5 to a fail-safe component 14, in the case shown to an emergency cutout switch. Such a fail-safe component 14 can for example also be an entry mat, a light barrier, a door lock or any other such device. In this case a switching contact 18 is connected to an input and to an output assigned to this. Usually the fail-safe component 14 is connected so that the switching contacts 18 are opened when the fail-safe component 14 is activated, in this case on actuation of the emergency cutout switch 14. Such switching of the switching contacts 18 between an output and an input of a peripheral circuit is usual in fail-safe systems. The external sensor, that is the fail-safe component 14, in this case the emergency cutout switch, is thus supplied by the output 4, 5 of the electronic circuit 1. To increase the safety the two contacts 18 of the electronic circuit 1 are controlled or monitored. Basically the the invention can however also be embodied by an electronic circuit with only one output and one input. In this case the test cycle 20 described below would only be half as long and would end at point in time 22. For safety requirements in compliance with SIL 2 in particular only one input and one output are sufficient.

Typically however there are a relatively large number of such inputs 2, 3 and outputs 4, 5 present on modules in any event, of which often only some are used. The invention now enables at least one part of the inputs/outputs 2 to 5 of standard circuits for to be used for fail-safe tasks, for operating an emergency cutout switch for example. Previous solutions use a special hardware for this which has been explicitly developed and embodied for safety applications. These usual solutions operate with separate input/output driver chips and are equipped with special input/output circuitry.

The driver chip 9 is used for converting the input signals or the output signals, especially for voltage conversion and for amplification of these signals. Reference symbol 17 indicates an internal short circuit in the driver chip 9. Reference symbols 34 to 37 indicate the output or input signals output or detected and evaluated by the control component 8.

FIG. 2 shows the timing of these signals recorded or output at points 34 to 37 in accordance with FIG. 1, especially during a test cycle 20. The progress over time is indicated by the reference symbol t. The curve 24 shows the timing of the output signal at point 34, the curve 25 the timing of the of the input signal at point 35, the curve 26 the timing of the output signal at point 36 and the curve 27 the timing of the input signal at point 37. The output signal 24 and the output signal 26 each correspond within the test cycle 20 to a test signal. The reference symbols 21, 22 and 23 indicate three points in time which identify the test cycle 20 and at which either the output signal 24 or the output signal 26 changes its value. In accordance with the exemplary embodiment shown in FIG. 1 and FIG. 2, the time constant of the input filters 6 and 7 is 20 ms in each case. Accordingly the test cycle 20 advantageously lasts 40 ms, with the output signal 24 being set to zero for 20 ms and for the following 20 ms the output signal 26 being set to zero. Values selected in this way for the time constant of the input filters 6, 7 or for the length of the test cycle 20 are typical values in a case in which a maximum reaction time to the actuation of the emergency cutout switch of 100 ms is demanded. In this case the test cycle 20 would be started every 100 ms. In the time not occupied by the test cycle within this 100 ms an actuation of the emergency cutout switch, i.e. an opening of the switching contacts 18, with the required reaction time, would also be detected within a maximum 100 ms.

An exemplary embodiment of the method in accordance with the invention is explained in greater detail below with reference to FIG. 1 and FIG. 2. Directly before point in time 21 the input signals 25 and 27 are evaluated at point 35 or 37 of the electronic circuit 1 by the control component 8. If one of the two input signals is on zero, an internal flag, which is processed and stored in the control component 8, is also set to zero, since this indicates an error or that an emergency cutout switch has been pressed. If this is not the case the internal flag is preset to one. At time 21, i.e. at the beginning of the test cycle 20, the output signal 24 is set by the control component 8 from one to zero. Immediately afterwards the input signal 25 at point 35, i.e. after the input filter 6, is interrogated, i.e. detected and evaluated by the control component 8. It is evaluated by the control component 8, and if the input signal 25 is zero at this time, the internal flag is set to the value zero, which indicates a possible hardware error, especially an internal short circuit in the driver chip 9. Immediately before the point in time 22, i.e. roughly in the middle of the test cycle 20, the input signal 27 is interrogated and evaluated at point 37 by the control component 8. If the input signal 27 is zero at this point in time, the internal flag is set to zero. Likewise the input signal 25 at point 35 is interrogated and evaluated at this time. If the input signal 25 has a value of one at this point in time, then the flag is set to zero, which in this case indicates an internal or external error (e.g. short circuit against one). At time 22 the output signal 24 is reset to one and the output signal 26 is set to zero. Immediately afterwards the input signal 27 is interrogated and evaluated at point 37 by the control component 8 If the input signal 27 has the value zero at this time, the internal flag is set to zero, i.e. a possible hardware error, e.g. internally on the electronic circuit is detected, especially an internal short circuit 17 in the driver chip 9. Finally, immediately before time 23 the input signal 25 at point 35 is interrogated and evaluated. If the input signal 25 is zero at this time, the internal flag is set to zero. Likewise the input signal 27 at point 37 is interrogated and evaluated. If the input signal 27 is one at this point in time, then the internal flag is set to zero, which indicates an internal or external error (e.g. short circuit against one). Finally at point in time 23, i.e. at the end of the test cycle 20, the output signal 26 is set back to the value one. If the input signal 27 has reached its original value or the point in time 28 is reached, then the electronic circuit 1 is being used again in compliance with specifications, i.e. is available here for interrogation by the emergency cutout switch.

In accordance with the exemplary embodiment of the invention the driver chip 9 is thus tested for internal short circuits, cross connections and interruptions, by the value at the input first being tested immediately (usually a few microseconds) after activation/command "change of the test signal" and subsequently again after expiry of the filter time constant. Because of the function of the input filter the input value may not change after its immediate reading. It may only change after the expiry of the filter time of the input filter. If it changes before this point this shows that there is a hardware error present (e.g. short circuit 17 or cross connection on the driver chip 9) and that there must be an automatic fail-safe reaction (e.g. safety input data to zero and error message).

In summary the invention thus relates to an electronic circuit 1 with at least one input 2, 3 and at least one output 4, 5, with the input 3 featuring an input filter 6, 7 for delaying a change of an input signal, where the delay is characterized by a time constant, and with a control component 8 being provided for provision of an output signal and for evaluation of the input signal. The invention also relates to a system with such an electronic circuit 1 and at least one fail-safe component 14, 18, which is connected to at least one input 2, 3 and at least one output 4, 5 of the circuit 1, as well as to a method for testing an electronic circuit. To increase the probability of error detection with such an electronic circuit 1 it is proposed that the control component 8 is provided for supply of a test signal for output via the output 4, 5 and for a first evaluation of the input signal immediately after output of the test signal and for a second evaluation of the input signal after expiry of a time after output of the test signal which at least corresponds to the time constant.

The invention claimed is:

1. An electronic circuit with error detection capability comprising:
   an input;
   an output having an input filter for delaying a change to an input signal by a time constant; and
   an activation control component coupled with the input and output for supply of output signals and for evaluation of input signals,
   wherein the control component supplies a test signal for output through the output, initially evaluates the input signal immediately after output of the test signal and evaluates the input signal after expiry of a time after output of the test signal which is based on the time constant and determines whether an error exists based on detection of a change in the input signal before expiry of the time which corresponds to the time constant.

2. The electronic circuit of claim 1, wherein the control component initially evaluates the input signal within a time after output of the test signal which amounts to a maximum of 10 percent of the time constant.

3. The electronic circuit of claim 1, wherein the control component determines whether an error exists by comparison of the input sign with the test signal.

4. The electronic circuit of claim 1, wherein the control component is further provided for initiating a fail-safe reaction provided the first evaluation produces an input signal equal to the test signal.

5. The electronic circuit of claim 1 further comprising: a driver chip provided for conversion of the input and output signals, wherein the driver chip is arranged between the control component and the input or the output.

6. The electronic circuit of claim 1, wherein the input is a digital input, and the output is a digital output.

7. The electronic circuit of claim 1, further comprising a second input and a second output.

8. The electronic circuit of claim 1, wherein the control component further comprises fail-safe firmware components.

9. The electronic circuit of claim 1 further comprising:
   a fail-safe component connected with the input and output, wherein the fail-safe component is provided for connecting the relevant input in an electrically conductive manner to the relevant output in a safe state.

10. An industrial automation system including an electronic circuit comprising:
    an input;
    an output;
    an input filter for delaying a change to an input signal wherein the delay is a time constant; and
    an activation control component coupled with the input and output for supply of output signals and for evaluation of input signals; wherein the control component (i) supplies a test signal for output through the output, (ii) performs a first evaluation of the input signal immediately after output of the test signal (iii) performs a second evaluation of the input signal after expiry of a time after output of the test signal which is based on the time constant (iv) and determines whether an error exists based on detection of a change in the input signal before expiry of the time which corresponds to the time constant; and a fail-safe component connected to the input of the circuit and the output of the circuit to connect relevant input in an electrically conductive manner to the relevant output in a safe state.

11. The industrial automation system of claim 10, wherein the control component conducts the first evaluation of the input signal within a time after output of the test signal which amounts to a maximum of 10 percent of the time constant.

12. The industrial automation system of claim 10, wherein the control component performs each of the first and the second evaluations with a comparison to the test signal.

13. The industrial automation system of claim 10, wherein the control component is further configured for initiating a fail-safe reaction provided the first evaluation produces an input signal equal to the test signal.

14. The industrial automation system of claim 10, further comprising, a driver chip provided for conversion of the input and output signals, wherein the driver chip is arranged between the control component and the input or the output.

15. The industrial automation system of claim 10, wherein the input is a digital input, and the output is a digital output.

16. The industrial automation system of claim 10, further comprising a second inputs and a second output.

* * * * *